US012716723B2

(12) United States Patent
Sanders et al.

(10) Patent No.: US 12,716,723 B2
(45) Date of Patent: Aug. 25, 2026

(54) OPTICAL CIRCUIT FOR COMPENSATING OPTICAL LEAD FLUCTUATIONS IN AN RFOG

(71) Applicant: Honeywell International Inc., Charlotte, NC (US)

(72) Inventors: Glen A. Sanders, Scottsdale, AZ (US); Marc Smiciklas, Phoenix, AZ (US); Jad Salman, Wayzata, MN (US)

(73) Assignee: Honeywell International Inc., Charlotte, NC (US)

( * ) Notice: Subject to any disclaimer, the term of this patent is extended or adjusted under 35 U.S.C. 154(b) by 285 days.

(21) Appl. No.: 18/534,399

(22) Filed: Dec. 8, 2023

(65) Prior Publication Data

US 2025/0189312 A1 Jun. 12, 2025

(51) Int. Cl.
*G01C 19/72* (2006.01)
*H01S 3/13* (2006.01)
*H01S 5/0687* (2006.01)

(52) U.S. Cl.
CPC ......... *G01C 19/721* (2013.01); *G01C 19/723* (2013.01); *G01C 19/727* (2013.01); *H01S 3/1305* (2013.01); *H01S 5/0687* (2013.01)

(58) Field of Classification Search
CPC ... G01C 19/721; G01C 19/723; G01C 19/727
See application file for complete search history.

(56) References Cited

U.S. PATENT DOCUMENTS 9,459,101 B1 * 10/2016 Strandjord ............ G01C 19/72
10,365,107 B2 7/2019 Sanders et al.
10,837,779 B2 11/2020 Strandjord et al.
11,204,246 B1 12/2021 Strandjord et al.
11,624,614 B1 4/2023 Strandjord et al.
(Continued)

FOREIGN PATENT DOCUMENTS

CN 113916211 A * 1/2011 .......... G01C 19/727
EP 2759803 A2 7/2014

OTHER PUBLICATIONS

Sanders, Glen et al. "Improvements of compact resonator fiber optic gyroscopes". 2017 DGON Inertial Sensors and Systems (ISS), Karlsruhe, Germany, 2017, pp. 1-12. (Year: 2017).*
(Continued)

*Primary Examiner* — Michael A Lyons
(74) *Attorney, Agent, or Firm* — Fogg & Powers LLC

(57) ABSTRACT

Systems and methods for compensating optical lead fluctuations in an RFOG include sources for generating first and second optical signals; an optical resonator; first and second lead lines connected to the sources and the resonator, wherein the sources couple the first and second optical signals into the first and second lead lines, and the first and the second lead lines couple the first and second optical signals into the optical resonator for propagation within the optical resonator in opposite directions; a tapping device coupled to the optical resonator that couples portions of the first and second optical signals out of the optical resonator; a combiner that combines the portions of the first and second optical signals to produce a combined output; and a photodetector that generates a beat note signal from the combined output.

20 Claims, 7 Drawing Sheets

(56) References Cited

U.S. PATENT DOCUMENTS

| | | | | |
|---|---|---|---|---|
| 2014/0240712 A1* | 8/2014 | Strandjord | ........... | G01C 19/727 356/461 |
| 2020/0025568 A1 | 1/2020 | Strandjord et al. | | |
| 2021/0055108 A1* | 2/2021 | Strandjord | ........... | G01C 19/721 |

OTHER PUBLICATIONS

Sanders, Glen et al. "Improvements to Signal Processing and Component Miniaturization of Compact Resonator Fiber Optic Gyroscopes". 2018 DGON Inertial Sensors and Systems (ISS), Braunschweig, Germany, 2018, pp. 1-22. (Year: 2018).*

European Patent Office, "Extended European Search Report", dated Feb. 5, 2025, from EP Application No. 24201221.9, from Foreign Counterpart to U.S. Appl. No. 18/534,399, pp. 1 through 10, Published: EP.

Sanders et al., "Modulation for Thermal Stability in Resonator Fiber Optic Gyroscope (RFOG)", U.S. Appl. No. 18/298,704, filed Apr. 11, 2023, pp. 1 through 20, Published: US.

Sanders et al., "Stability Enhanced Resonator Fiber Optic Gyroscope (RFOG)", U.S. Appl. No. 18/349,715, filed Jul. 10, 2023, pp. 1 through 29, Published: US.

Strandjord et al., "Improved Bias Performance in Resonator Fiber Optic Gyros using a Novel Modulation Method for Error Suppression", 26th International Conference on Optical Fiber Sensors, Lausanne Switzerland, Sep. 24-28, 2018, OSA Technical Digest, (Optica Publishing Group, 2018), Paper ThD3, pp. 1 through 4.

* cited by examiner 400
401
403
405
406
407
408
409
411
413
415
417
419
421
423
425
427
429
431
433
435
437
439
441
443
445
447
449
451
455
457
459
461
463
465
467
469
471
473

OPTICAL CIRCUIT FOR COMPENSATING OPTICAL LEAD FLUCTUATIONS IN AN RFOG

STATEMENT REGARDING FEDERALLY SPONSORED RESEARCH OR DEVELOPMENT

This invention was made with Government support under FA9453-20-C-0013, awarded by the Air Force Research Laboratory. The Government has certain rights in the invention.

BACKGROUND

Gyroscopes have been used to measure rotation rates or changes in angular velocity about an axis of rotation. A basic conventional fiber optic gyro (FOG) includes an optical source, an optical beam-generating device, and a coil of optical fiber coupled to the optical beam-generating device, where the coil encircles an area. The optical beam-generating device generates optical signals for coupling into the coil, where at least two optical signals propagate in opposite directions. For example, one optical signal propagates in a clockwise (CW) direction and another optical signal propagates in a counterclockwise (CCW) direction along the core of the optical fiber. Many FOGs utilize glass-based optical fibers that guide light along a solid glass core of the fiber. When the RFOG is experiencing rotations, the two counter-propagating (e.g., CW and CCW) optical signals experience different path lengths while propagating around a rotating closed optical path within the coil. The difference in the two path lengths is proportional to the rotational rate normal to the enclosed area.

In a typical resonator fiber optic gyroscope (RFOG), the counter-propagating light beams are highly coherent and circulate through multiple turns of the fiber optic coil. Often, a device (such as a fiber coupler) redirects a portion of the light that has passed through the coil back into the coil for recirculation through the fiber optic coil. Often, light makes multiple passes around the fiber optic coil. The optical beam-generating device modulates and/or shifts the frequencies of each counter-propagating light beam so that the resonance frequencies of the resonant coil may be observed. The resonance frequencies for each of the CW and CCW paths through the coil are based on a constructive interference condition, where light waves that traverse the coil a different number of times are in-phase or add constructively at any point in the coil. Because of this constructive interference condition, optical waves with a particular wavelength can be referred to as "on resonance" when the round-trip resonator optical path length equals an integral number of wavelengths. Rotation about the axis of the coil produces a different optical path length for clockwise and counterclockwise propagation, thus producing a shift between the respective resonance frequencies of the resonator. The frequency difference, measured by tuning the CW beam and CCW beam frequencies to match the resonance frequency shift of the closed optical path caused by rotation, can be used to determine the rotation rate.

SUMMARY

Systems and methods for an optical circuit for compensating optical lead fluctuations in an RFOG are described herein. In certain embodiments, a resonant fiber optic gyroscope (RFOG) includes at least two optical signal sources configured to generate a first optical signal and a second optical signal; and an optical resonator. The RFOG further includes a first lead line connected to the optical source and the optical resonator, wherein the optical source couples the first optical signal into the first lead line, and the first lead line couples the first optical signal into the optical resonator for propagation in a first direction within the optical resonator. The RFOG also includes a second lead line connected to the optical source and the optical resonator, wherein the optical source couples the second optical signal into the second lead line, and the second lead line couples the second optical signal into the optical resonator for propagation in a second direction within the optical resonator, wherein the second direction is opposite the first direction. Additionally, the RFOG includes a tapping device coupled to the optical resonator, wherein the tapping device couples a portion of the first optical signal propagating in the optical resonator and a portion of the second optical signal propagating in the optical resonator out of the optical resonator. Moreover, the RFOG includes a combiner coupled to the tapping device, wherein the combiner combines the portion of the first optical signal and the portion of the second optical signal to produce a combined output. Also, the RFOG includes one or more photodetectors coupled to receive the combined output from the combiner, wherein the one or more photodetectors generate a beat note signal from the combined output.

BRIEF DESCRIPTION OF DRAWINGS

Drawings accompany this description and depict only some embodiments associated with the scope of the appended claims. Thus, the described and depicted embodiments should not be considered limiting in scope. The accompanying drawings and specification describe the exemplary embodiments, and features thereof, with additional specificity and detail, in which:

Figure 1:
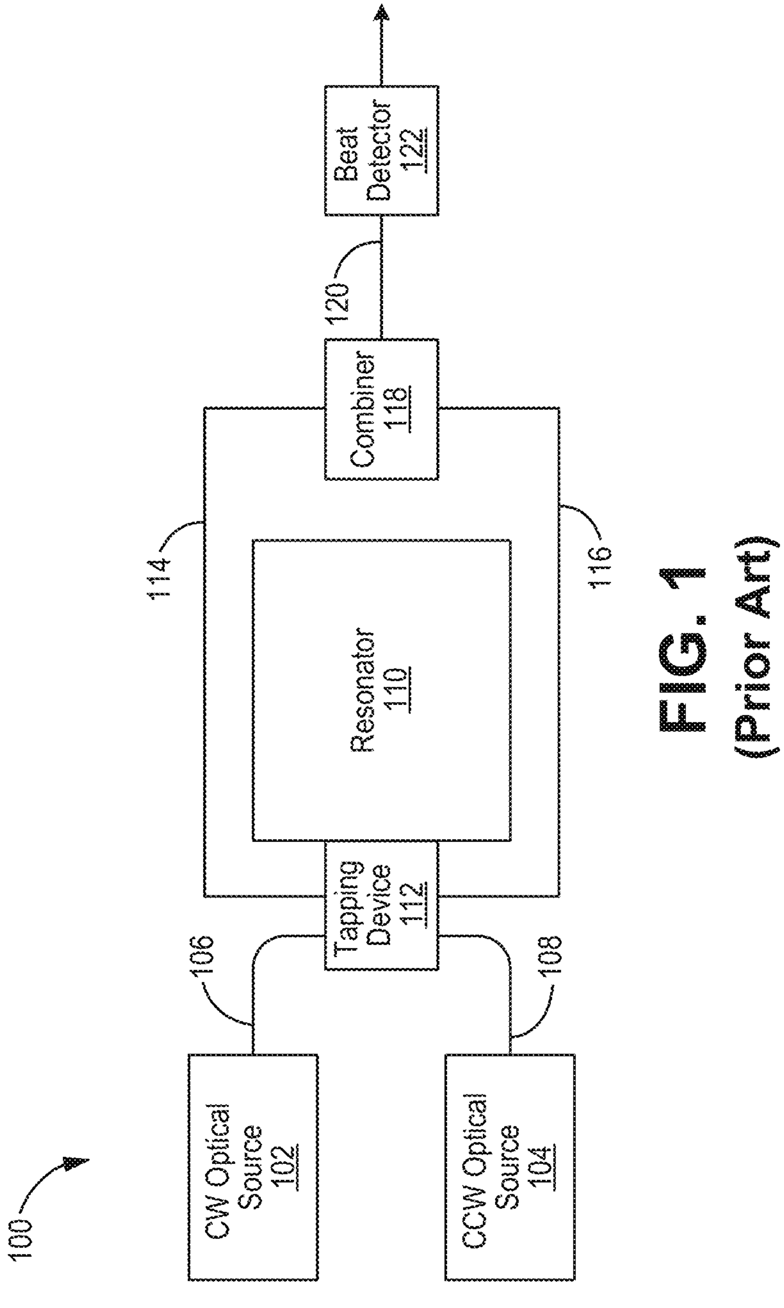
FIG. 1 is a block diagram illustrating typical system for compensating optical lead fluctuations in an RFOG.

Per common practice, the drawings do not show the various described features according to scale, but the drawings show the features to emphasize the relevance of the features to the example embodiments.

DETAILED DESCRIPTION

The following detailed description refers to the accompanying drawings that form a part of the present specification. The drawings, through illustration, show specific illustrative embodiments. However, it is to be understood that other embodiments may be used and that logical, mechanical, and electrical changes may be made.

Systems and methods for compensating optical lead fluctuations using an optical circuit in an RFOG are described herein. In particular, an optical circuit picks off optical signals from inside a resonator or immediately after the optical signals pass out of the resonator coil—for example, the optical circuit picks off the resonator's CW and CCW optical signals. A system can use the picked-off optical signals to measure input lead fluctuations and compensate gyroscope output to provide precise rotation rate information.

In some RFOGs, the temperature fluctuations of the optical fibers that connect the optical sources to the optical resonator can cause slight changes in the optical frequencies of the input laser light before reaching the resonator and propagating in the clockwise and counterclockwise directions of the resonator. Because these light waves are used to detect exact resonance frequencies of the resonator, the RFOG may erroneously determine that the resonance frequencies of the resonator have changed, when the resonances were unchanged. If the input lead fluctuations are not exactly the same for the CW and CCW input waves, the observed erroneous changes in the CW and CCW resonance frequencies will be different, which translates into an incorrect observation of rotation rate change ("bias error"). These changes in the optical frequencies of the input light occur because of the varying indices of refraction and physical path lengths of the fibers, resulting in fluctuations in their optical path lengths, or altering the phase of the input light. However, matching the fibers of the two signal paths with high precision is difficult. Thus, temperature fluctuations can cause differences in the frequencies of the signals near the optical sources and on the input path to the optical resonator. RFOGs can detect frequency differences as small as tenths of a microhertz, but even small temperature changes can cause undesirable bias errors.

Because the frequency measurements of the clockwise and counterclockwise optical signals are made by devices that are close to the clockwise optical source and the counterclockwise optical source, additional bias errors can arise due to time-varying electrical phenomena, such as offset voltages drifting over time and noise in electrical circuitry in feedback loops in the RFOG. Time-varying electrical phenomena also result in the difference between the clockwise and counterclockwise optical signals frequencies proximate to the optical sources and those proximate to the RFOG's optical resonator. Therefore, a need exists to reduce the above-described bias errors.

One way to reduce bias errors is using a low-coupling-ratio tapping device in the optical resonator coil path. The tapping device taps off a small amount of light in both the CW and CCW directions, combines those light waves, and detects the combined light waves to form a beat note signal. The beat note signal is processed and used to compensate for the bias errors in the output of the gyro due to input lead fluctuations. In typical systems, a portion of the CW optical signal and a portion of the CCW optical signal are tapped off prior to reaching the resonator but as close as technically possible to the resonator input to detect and compensate input lead fluctuations. In some implementations, the tapping device can be a fiber optic coupler or a small beam diverter in the resonator path on the input optical assembly. However, tapping light prior to entry of the optical signals into the resonator has significant limitations in RFOGs where the input light is modulated to effect signal processing. For instance, when this approach is used in an RFOG using Sideband Heterodyne Detection (SHD) modulation (described later), the implementation of SHD may cause severe signal fading of resultant beat note signals. Systems and methods described herein allow for the reduction of errors that arise during the beat note compensation of lead fluctuations.

In embodiments described herein, the tapping device taps the optical signals out of the resonator after the optical signal has propagated within the resonator through what is known as the "transmission port." When optical signals are transmitted out of the resonator, two coupling devices may be used, one coupling device on each output arm of the resonator. The coupling devices extract a portion of the optical signals propagating in the CW and CCW directions, combine the extracted optical signals, and form a beat note signal. Propagation of the light within the resonator may also filter out undesirable modulation sidebands to ensure that the beat note signals are free from large variations caused by modulations implemented in some RFOG implementations.

FIG. 1 is a block diagram illustrating a typical system 100 for an RFOG. The system 100 includes a clockwise (CW) optical source 102 and a counterclockwise (CCW) optical source 104. The CW optical source 102 includes the circuitry that provides an optical signal for coupling into a resonator 110 for propagation within the resonator 110 in the CW direction. Similarly, the CCW optical source 104 includes the circuitry that provides an optical signal for coupling into the resonator 110 for propagation within the resonator 110 in the CCW direction. As used herein, an optical source may be a laser (like a diode laser, a vertical cavity surface emitting laser, etc.), a light emitting diode, an amplifier for amplifying light from another light source, and the like, or even combinations of the aforementioned devices. While the terms CW and CCW describe the direction of propagation within the resonator 110, the terms are relative and imply that optical signals provided by the CW optical source 102 and the CCW optical source 104 propagate in opposite directions within the resonator 110. As used herein, the resonator 110 (also referred to as a resonator coil) may refer to multiple turns or windings of optical fiber with a device to recirculate the light within the resonator coil.

As described herein, the optical signals provided by the CW optical source 102 and the CCW optical source 104 are respectively coupled into the resonator 110 through a CW lead line 106 and a CCW lead line 108. In particular, the CW lead line 106 couples the light produced by the CW optical source 102 into the resonator 110, and the CCW lead line 108 couples the light produced by the CCW optical source 104 into the resonator 110.

The propagation of light through the CW lead line 106 and the CCW lead line 108 is sensitive to temperature changes. In particular, temperature changes can lead to fluctuations in the frequency of the optical signals propagating towards, and through the resonator 110. For example, temperature changes can alter the index of refraction and the physical path lengths of the CW lead line 106 and the CCW lead line 108, which physical characteristics changes cause frequency fluctuations in the optical signals. Temperature gradients increase the difficulty of matching the lead length fluctuations in the optical signal paths lengths of the CW lead line 106 and CCW lead line 108 with high precision. This difficulty in matching the signal path lengths means that temperature fluctuations can cause differences in the frequencies of the signals coupled from the CW optical source 102 and the CCW optical source 104 into the resonator 110. When RFOGs detect rotations based on frequency differences as small as tenths of a microhertz, even small temperature changes result in undesirable bias errors.

Further, frequency measurements of the CW and CCW optical signals are made proximate to the CW optical source 102 and the CCW optical source 104. The CW optical source 102 and the CCW optical source 104 use electrical circuitry to generate the respective optical signals, control the frequencies of the optical signals, and perform feedback loops that involve time-varying electrical phenomena. The time-varying electrical phenomena also cause differences between the frequencies of the CW and CCW optical signals proximate to the optical sources and those proximate to the resonator 110, which also result in undesirable bias errors.

To resolve the bias errors the signals provided to the resonator 110 may be interfered with one another as they are provided to the resonator 110 from the leads. The resulting beat signal may then be used to rectify the bias that results from the differences between the resonant frequencies of the CW and CCW optical signals caused by the time-varying fluctuations. To extract the CW and CCW optical signals, the system 100 may include a tapping device 112 that taps a portion of the light provided for propagation in both the CW and CCW directions within the resonator 110 before propagation within the resonator 110. As described herein, the tapping device 112 may be any device that couples light provided through the CW lead line 106 and the CCW lead line 108 to the resonator 110 before propagation within the resonator 110. The tapping device 112 may be an optical coupler placed between the CW lead line 106 and the CCW lead line 108 and the resonator 110. Alternatively, the tapping device 112 may be implemented as optical components on an optical assembly, like a silicon optical bench.

In certain embodiments, the system 100 includes a combiner 118. In particular, the first output optical path 114 and the second output optical path 116 from the tapping device 112 are coupled to a combiner 118. The combiner 118 is an optical device that receives different optical signals through different input ports and combines the received signals for output through an output port. For example, the combiner 118 may receive the CCW optical signal from the first output optical path 114 and the CW optical signal from the second output optical path 116 and combine the signals for output to the combined optical path 120.

In further embodiments, the system 100 includes a beat detector 122 that receives the combined signal from the combined optical path 120. The beat detector 122 detects the combined signal to form a beat note signal. The beat note signal represents a frequency separation between the CW optical signal and the CCW optical signal. The beat note signal can be processed to measure input lead fluctuations and to compensate for the bias caused by the lead fluctuations. Thus, the RFOG may provide more accurate rotation rate information.

In certain implementations, RFOGs may implement sideband heterodyne detection (SHD). When an RFOG implements SHD, a common frequency modulation modulates the CW and CCW optical signals. Then, additional sideband heterodyne detection (SHD) modulation frequencies modulate the CW and CCW optical signals, and the CW SHD modulation frequency is slightly different than the CCW sideband modulation frequency. The sideband modulation frequencies may be relatively high compared to the common modulation frequency. The application of SHD frequency modulation of the CW and CCW optical signals results in harmonic components of the optical signals centered on the respective carrier frequencies of the CW and CCW optical signals, where the sideband modulation frequencies generate separate harmonic components for the CW and CCW directions. Frequently, the sideband modulation frequencies can be each set close to a frequency that is half, or odd multiples of a half of the free spectral range (FSR) of the resonator 110. As used herein, an FSR for the resonator 110 is the difference in frequencies between adjacent resonant frequencies of the resonator 110. Thus, every other harmonic of the sideband modulations is at, or nearly at, a resonant frequency of the resonator 110.

In RFOGs that implement SHD, where the sidebands are created at half of the FSR by modulating at that frequency or nearly that frequency, or created at an odd multiple of half the FSR by modulating at that frequency or near that frequency, an RFOG can adjust the carrier frequency of the CW and CCW optical signals to be at a resonance peak of the resonator 110 or halfway between the resonance peaks of the resonator 110. When the carrier frequency is set to a frequency halfway between the resonance peaks of the resonator 110, the odd harmonics of the CW and the CCW optical signals will be at the resonance peaks of the resonator 110. Thus, the first-order harmonics of the CW and the CCW optical signals pass through the resonator 110 and interfere with one another. Then the CW and the CCW optical signals are detected and the detected signal is demodulated at twice the modulation frequency of the sideband modulation frequency. At this point, the CW and CCW demodulated signals are then demodulated at the common, low-frequency modulation frequency. Thus, the resonance frequencies of the CW and CCW directions are determined, as the difference between them is due to rotation (in the case of no-bias errors). However, bias errors are caused by the input lead fluctuations.

Figure 2A:
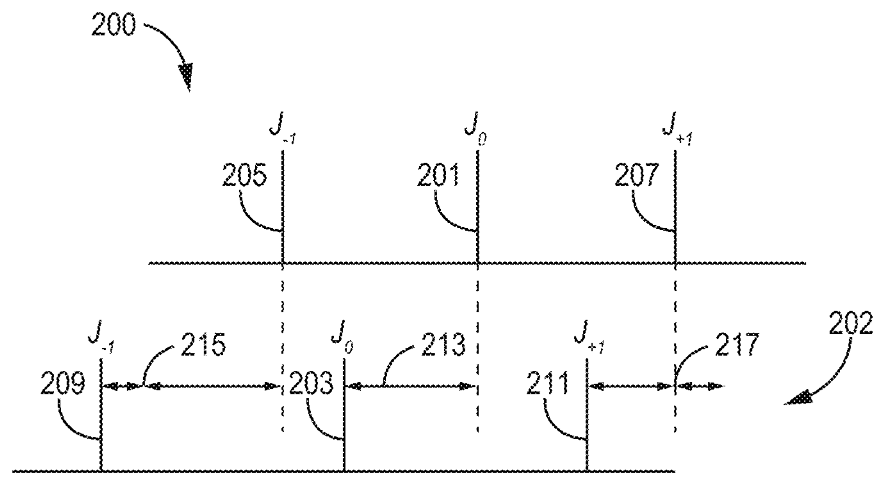
FIGS. 2A and 2B are graphs illustrating the effects of sideband heterodyne modulation in a typical system for compensating optical lead fluctuations in an RFOG.
Figure 2B:
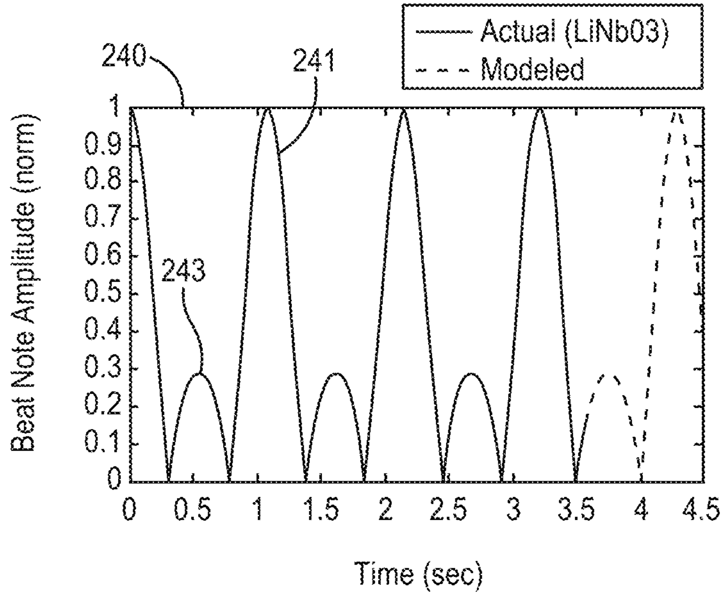

However, systems (like the system 100) that implement tapping devices that tap out the optical signals from the lead lines before resonating within the resonator are subject to errors. In particular, tapping out optical signals before the resonator 110 is subject to errors in systems that implement SHD. When the light is tapped out before the resonator 110 after SHD modulation, the optical signals will comprise multiple spectral components that are then beat against each other. Also, when the different components are beat against each other, the differences between the different components may cause the amplitude of the combined effect of the different beat notes to be effectively zero. When the amplitude of the combined effect of the different beat notes is zero, the RFOG may be unable to acquire phase information for compensating the lead fluctuations. FIGS. 2A and 2B illustrate the errors that can arise when attempting to compensate for lead line fluctuations in a typical RFOG like the RFOG in system 100.

FIG. 2A is a diagram illustrating the frequency components of the carrier and first-order sidebands as provided to the resonator by the lead lines. As shown, FIG. 2A illustrates CW frequency components 200 and CCW frequency components 202. The CW frequency components 200 include a CW carrier component 201, an upper CW sideband 207, and a lower CW sideband 205. Similarly, the CCW frequency components 202 include a CCW carrier component 203, an upper CCW sideband 211, and a lower CCW sideband 209. While only one set of sidebands is illustrated for each direction, higher-order sidebands are also present but at decreasing amplitudes in proportion to the order of the sidebands.

When a tapping device 112 couples the optical signals out of the lead lines before propagation within the resonator, all the components of the signals affected by the lead line fluctuations are present. As the lead line fluctuations may change the frequencies of the two signals, ideally (no modulation, no sidebands present), the carriers of each beam beat and the fluctuations in the beat note are representative of the true frequency fluctuations as observed by the resonator. In such a case, there are no errors, provided the distance between the optical pickoff for the beat note signal is a vanishingly small distance from the input to the resonator. The ideal beat note signal contains rotation rate information that is free of lead length errors. In the non-ideal beat note scheme where modulation and numerous sidebands exist on the light, the frequency sidebands of the CW input and the CCW input will beat with each other at a frequency that can be close to the beat frequency between carriers. These beats between sidebands, combined with the beats between the carriers can cause the total signal on the beat note detector to periodically become zero amplitude. This results in a noisy and practically unusable beat note signal because the phase and frequency are indeterminable. For example, sideband CW sideband 205 and CCW sideband 209 will beat at a frequency close to that at which CW carrier 201 and CCW carrier 203 will beat. Likewise, CW sideband 207 and CCW sideband 211 will beat at a frequency close to that at which CW carrier 201 and CCW carrier 203 will beat. The combination of all these beat signals causes a time-varying signal as depicted in FIG. 2B.

FIG. 2B illustrates a diagram of a graph showing the amplitude of the beat note formed from the combination of the signals provided by the lead lines. The detected signal contains the beat between various pairs of sidebands and of the pair of carriers. That is, the detected signal contains a beat note between sidebands 205 and 209 (lower sideband beat note) plus the beat note between carriers 201 and 203 (carrier beat note) plus the beat note between sidebands 207 and 211 (upper sideband beat note). As shown, the graph 240 illustrates a first periodic portion 241 and a second periodic portion 243. The first periodic portion 241 corresponds to when the carrier beat note and the sideband beat notes are additive in amplitude. The second periodic portion 243 corresponds to when the carrier beat note and the sideband beat notes are less additive, diminishing the size of the signal. There are times, as seen in the figure when transitioning between 243 and 241, where the total signal size is zero. Thus, the amplitude of the combined effect periodically passes through zero as the carrier beat note and the sideband beat notes cancel each other. When the amplitude of the combined effect is zero, the RFOG cannot acquire beat note phase and frequency information that is free of bias errors due to lead fluctuations.

Figure 3:
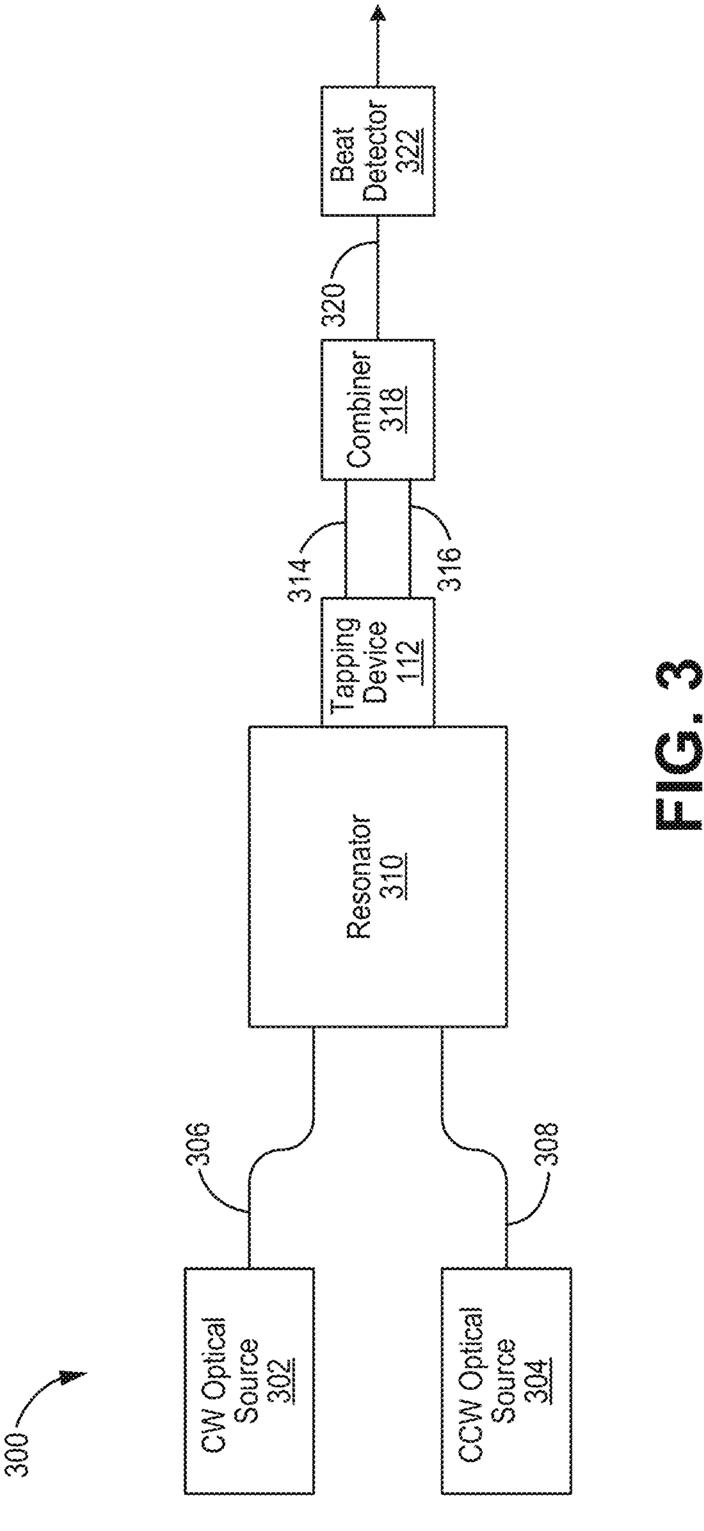
FIG. 3 is a block diagram illustrating a system implementing an optical circuit for compensating optical lead fluctuations in an RFOG according to an aspect of the present disclosure.

FIG. 3 is a block diagram illustrating a system 300 for compensating optical lead fluctuations using an optical circuit within an RFOG where the tapping device taps light out of the resonator after propagating within the resonator 310. Similar to the system 100, the system 300 includes a clockwise (CW) optical source 302 and a counterclockwise (CCW) optical source 304 that function substantially similar to the CW optical source 102 and the CCW optical source 104. The CW optical source 302 includes the circuitry that provides an optical signal for coupling into a resonator 310 for propagation within the resonator 310 in the CW direction. Similarly, the CCW optical source 304 includes the circuitry that provides an optical signal for coupling into the resonator 310 for propagation within the resonator 310 in the CCW direction. As used herein, the resonator 310 (also referred to as a resonator coil, although the resonator 310 does include a recirculating device in an optical assembly to recirculate light in the coil and provide for introducing light into/out of the coil, in addition to the coil) may refer to multiple turns or windings of optical fiber with a device to recirculate the light within the resonator coil.

As described herein, the optical signals provided by the CW optical source 302 and the CCW optical source 304 are respectively coupled into the resonator 310 through a CW lead line 306 and a CCW lead line 308. In particular, the CW lead line 306 couples the light produced by the CW optical source 302 into the resonator 310, and the CCW lead line 308 couples the light produced by the CCW optical source 304 into the resonator 310. In some implementations, the CW lead line 306 and the CCW lead line 308 are coupled into an optical assembly for coupling the CW optical signal and the CCW optical signal into the resonator 310 or coupled into the resonator 310 with a different optical component (such as an optical coupler, free space optics, and the like).

As mentioned above, the propagation of light through the CW lead line 306 and the CCW lead line 308 is sensitive to temperature changes. In particular, temperature changes can lead to fluctuations in the frequency of the optical signals propagating towards, and through the resonator 310. When RFOGs detect rotations based on frequency differences as small as tenths of a microhertz, even small temperature changes result in undesirable bias errors. Further, frequency measurements of the CW and CCW optical signals are made proximate to the CW optical source 302 and the CCW optical source 304. The CW optical source 302 and the CCW optical source 304 use electrical circuitry to generate the respective optical signals, control the frequencies of the optical signals, and perform feedback loops that involve time-varying electrical phenomena. The time-varying electrical phenomena also cause differences between the frequencies of the CW and CCW optical signals proximate to the optical sources and those proximate to the resonator 310, which also result in undesirable bias errors.

In certain implementations, where an RFOG implements SHD, a common frequency modulation modulates the CW and CCW optical signals and additional SHD modulation frequencies modulate the CW and CCW optical signals, where the CW SHD modulation frequency is slightly different than the CCW sideband modulation frequency. Further, an RFOG can adjust the carrier frequency of the CW and CCW optical signals to be at a resonance peak of the resonator 310 or halfway between the resonance peaks of the resonator 310. When the carrier frequency is set to a frequency halfway between the resonance peaks of the resonator 310, the odd harmonics of the CW and the CCW optical signals will be at the resonance peaks of the resonator 310. Thus, the first-order harmonics of the CW and the CCW optical signals pass through the resonator 310 and interfere with one another. Then the CW and the CCW optical signals are detected, and the detected signal is demodulated at twice the modulation frequency of the sideband modulation frequency. At this point, the CW and CCW demodulated signals are then demodulated at the common, low-frequency modulation frequency. Thus, the resonance frequencies of the CW and CCW directions are determined, as the difference between them is due to rotation (in the case of no-bias errors). However, bias errors are caused by the input lead fluctuations.

As stated above, to resolve the bias errors, the signals emanating from the resonator 310 are provided to a tapping device 112 and combiner 318 to interfere with one another as they are provided to the resonator 310 from the leads and then propagate within the resonator 310. The resulting beat signal may then be used to rectify the bias, or give a signal that is free from bias errors, that results from the differences between the resonant frequencies of the CW and CCW optical signals caused by the time-varying fluctuations. However, when the first-order harmonics are on resonance, variations between the different harmonics of the CW and CCW optical signals can cause the upper first order harmonic and the lower first order harmonics to combine such that the amplitude of the associated beat from interference of CW and CCW optical signals may experience signal fade due to interference signals. Because the combination of the first order harmonics can lead an associated signal to have either a zero amplitude, the presence of the first order harmonics can lead to errors in the resultant beat signal that negatively affect the compensation of the lead line fluctuations. Also, if the optical signals are tapped out before propagating within the resonator 310, the presence of the multiple harmonics and carrier frequency can also combine in ways that cause signal fade (i.e. the signal amplitude becoming small, or zero, periodically in time) due to the interference of the multiple components. As lead fluctuations bias the rotation information provided by the RFOG, the presence of the first order harmonics negatively impact the ability of the RFOG to compensate the lead line fluctuations and resultant bias error.

In certain embodiments, the system 300 suppresses the first order harmonics before interfering the CW and CCW optical signals. As the first order harmonics are suppressed, the first order harmonics are unable to combine in such a way to drive the associated beat note signal between CW or CCW optical signal to a small or zero amplitude. As such, the system 300 is able to use the resultant beat signal to more accurately compensate for the bias that results from the lead fluctuations. In particular, the system 300 is able to suppress the first order harmonics by centering the carrier frequency on a resonance peak of the resonator 310 and then beating the CW and the CCW optical signals with each other after propagation within the resonator 310. The system 300 suppresses the first-order harmonics because the centering of the carrier frequency on a resonance peak causes odd-numbered harmonics to be off resonance. Accordingly, the odd-numbered harmonics will destructively interfere within the resonator 310. While the carrier and even-numbered harmonics resonate within the resonator 310, the amplitude of the carrier will be substantially greater than the amplitude of the second-order harmonics, such that the combination of the second-order harmonics will be smaller than the amplitude of the component at the carrier frequency. In this case, the beat note signal does not reach a zero amplitude. Accordingly, the beat note signal between CW and CCW optical signals can be detected to compensate for the lead fluctuations.

In certain embodiments, to extract the CW and CCW optical signals after propagation through the resonator 310, the system 300 may include a tapping device 112 that taps a portion of the light propagating in both the CW and CCW directions within the resonator 310. As described herein, the tapping device 112 may be any series of devices that couples light propagating along resonant paths in the resonator 310 into optical paths outside the resonator 310. In some implementations, the tapping device 112 may be an optical coupler installed on the resonant path of the resonator 310. In other implementations, the tapping device 112 may be implemented as optical components on an optical assembly, like a silicon optical bench. In some implementations, the tapping device 112 couples a small portion of the light propagating in the resonant path of the resonator 310 into a first output optical path 314 and a second output optical path 316. For example, the tapping device 112 may couple 30 percent of the light propagating in the resonant path of the resonator 310 into the first output optical path 314 and the second output optical path 316.

When the tapping device 112 is an optical coupler, the optical coupler is an optical device that transfers optical signals between optical fibers. In particular, two optical paths pass through the optical coupler, where the optical coupler brings the two optical paths into a coupling region. Within the coupling region, light is coupled between the different optical paths. The portion of light coupled out of a particular optical path depends on the optical characteristics of the different optical paths within the coupling region. Regarding the placement of the optical coupler within the resonant path of the resonator 310, the light propagating within the resonator 310 passes through an optical path in the optical coupler that is a portion of the resonant optical path of the resonator. For example, the resonant optical path may have a first port and a second port on opposite sides of the optical coupler. The CW optical signal is received through the first port, and a portion of the CW optical signal is output through the second port. Similarly, the CCW optical signal is received through the second port, and a portion of the CCW optical signal is output through the first port. Further, a portion of the light in the resonant optical path is coupled into a coupled path based on the optical characteristics of the optical paths within the coupling region, where the coupled path has a first coupled port and a second coupled port. For example, a portion of the CW optical signal received through the first port is coupled to be output through the second coupled port, and a portion of the CCW optical signal received through the second port is coupled to be output through the first coupled port. The first coupled port may be coupled to a first output optical path 314, and the second coupled port may be coupled to a second output optical path 316.

When the tapping device 112 is implemented in an optical assembly, the optical assembly may be a platform used to mount and align optical components on a silicon substrate, such as a silicon optical bench. The optical components may include various waveguides, mirrors, lenses, beam splitters, polarizers, wave plates, prisms, among other optical components. An optical assembly can receive light through an input port or ports, perform various modifications of the light, and provide the light to one or more output ports. When the optical assembly incorporates the tapping device 112, the optical assembly that introduces the CW optical signal and the CCW optical signal into the resonator 310 can also include optical components in the resonant path of the resonator 310 that couple portions of the light in the resonant path out of the resonant path of the resonator 310. In particular, the optical assembly may couple light propagating in the CCW direction to a first output port coupled to a first output optical path 314 and light propagating in the CW direction to a second output port coupled to a second output optical path 316.

In certain embodiments, the system 300 includes a combiner 318. In particular, the first output optical path 314 and the second output optical path 316 from the tapping device 112 are coupled to a combiner 318. The combiner 318 is an optical device that receives different optical signals through different input ports and combines the received signals for output through an output port. For example, the combiner 318 may receive the CCW optical signal from the first output optical path 314 and the CW optical signal from the second output optical path 316 and combine the signals for output to the combined optical path 320.

In further embodiments, the system 300 includes a beat detector 322 that receives the combined signal from the combined optical path 320. The beat detector 322 detects the combined signal to form a beat note signal. The beat note signal contains a major frequency tone at a frequency that is the frequency separation between the CW optical signal and the CCW optical signal carriers. The beat note signal can be processed to measure input lead fluctuations and to compensate for the bias caused by the lead fluctuations or may be configured to give rate information that is free from the bias due to lead length fluctuation. Thus, the RFOG may provide more accurate rotation rate information.

Figure 4:
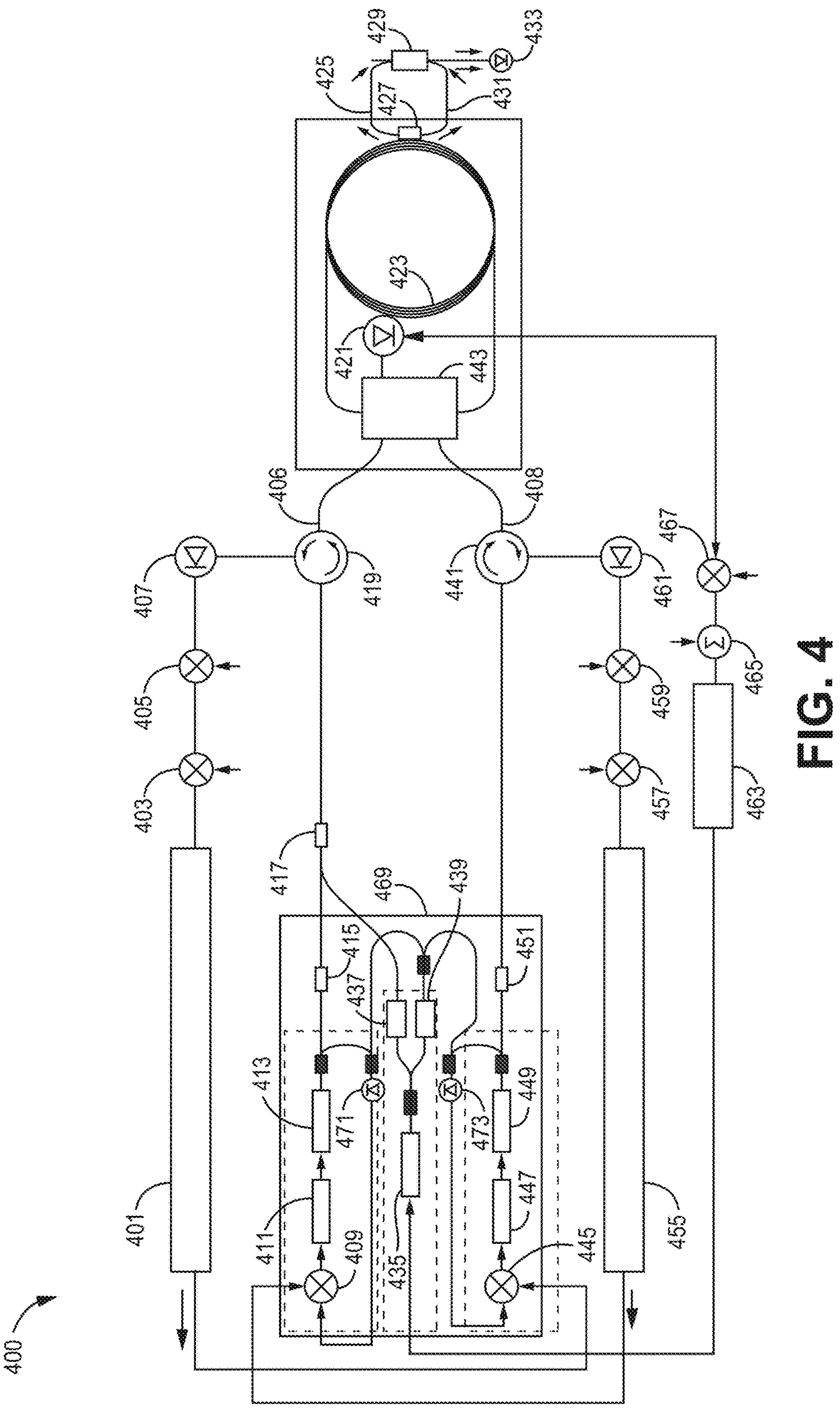
FIG. 4 is a schematic illustrating an RFOG that implements an optical circuit for compensating optical lead fluctuations according to an aspect of the present disclosure.

FIG. 4 is a block diagram of a system that incorporates an optical circuit for compensating optical lead fluctuations in an RFOG 400. In particular, the optical circuit in the RFOG 400 may use a tapping optical coupler 427 in the resonant path of a resonator 423 to couple light out of the resonator for compensating fluctuations in the lead lines 406 and 408. The light coupled out of the resonator 423 by the tapping optical coupler 427 can be used to detect and measure input lead fluctuations for compensating bias in the gyro output caused by the fluctuations in the lead lines. Further, as shown, the RFOG 400 also implements SHD when modulating and demodulating the CW and CCW optical signals.

The exemplary RFOG 400, illustrated in FIG. 4, includes a master optical source 435, a CW optical source 413, a CCW optical source 449, integrated photonics circuitry (IPC) 469, an optical bench (or optical bench circuitry) 443, a CW optical phase lock loop (CW OPLL or CW OPLL circuitry) 411, CCW optical phase lock loop (CCW OPLL or CCW OPLL circuitry) 447, a Pound-Drever-Hall (PDH) servo (or PDH servo circuitry) 463, an optical fiber coil (resonator coil) 423, which when combined with some components on the optical bench 443 becomes a resonator (herein, element 423 is referred to as a "resonator" which technically includes the resonator coil and some elements on the optical bench 443, a CCW resonance tracking servo (or CCW resonance tracking servo circuitry) 401, and CW resonance tracking servo (or CW resonance tracking servo circuitry) 455. This illustrated embodiment is described for pedagogical purposes, and the embodiments of the invention can be implemented using systems with configurations that differ from the configuration illustrated in FIG. 4. Signals emitted by the CW optical source 413, the CCW optical source 449, and the master optical source 435 may be referred to, respectively, as the CW optical signal, the CCW optical signal, and the master optical signal.

For example, the photonics circuitry of the integrated photonics circuitry 469 and the optical assembly 443 are each integrated; however, in other embodiments, the photonics circuitry of the integrated photonics circuitry 469 and/or the optical assembly 443 may be implemented as separate components. Thus, the integrated photonics circuitry 469 may include discrete photonics circuitry. The discrete photonics circuitry may be integrated on a common substrate, where the common substrate comprises a semiconductor and/or an insulator. In some implementations, the substrate may be a doped or undoped semiconductor. The integrated photonics circuitry 469 integrates various components on the substrate. The integrated various components may include the master optical source 435, the CW optical source 413, CCW optical source 449, the CW OPLL 411, the CCW OPLL 447, modulators 437 and 439, optical couplers, a first photodetector 471, and a second photodetector 473 on a substrate. In some implementations, some or all of the components on the 469 may be implemented as a multi-frequency laser source (MFLS). An MFLS is a device capable of emitting lasers at multiple frequencies. Alternatively, the components listed as part of the integrated photonics circuitry 469 may be separate components coupled to each other through waveguides, optical fibers, wires, or other communicative mediums.

The integrated photonics circuitry 469 is configured to prepare the optical signals generated respectively by the master optical source 435, the CW optical source 413, and the CCW optical source 449 for introduction into the resonator 423. The master optical source 435 generates a master optical signal that is used to stabilize the frequency of the light provided by the CW optical source 413 and CCW optical source 449, and specifically provide very little frequency noise between the sources. Further, the light provided by the master optical source 435 may be phase modulated by a common phase modulator 439 and beat with the CW and CCW optical signals. For example, the master optical signal may be modulated by the common phase modulator 439 to provide a modulation for the CW and CCW optical signals so that the resonant frequencies of the resonator 423 may be ascertained. The modulated master optical signal may be coupled into a photodetector 471 with the CW optical signal produced by the CW optical source 413 so that the optical phase lock loop 411 will impart the common modulation to the CW optical signal. Similarly, the modulated master optical signal may then be coupled into a photodetector 473 with the CCW optical signal produced by the CCW optical source 449 so that the optical phase lock loop 411 will impart the common modulation to the CW optical signal.

In some implementations, the beat signals produced by the first photodetector 471 and second photodetector 473 are respectively coupled into the mixers 409 and 445, where the signals are mixed with signals produced by the respective CW resonance tracking servo 455 and the CCW resonance tracking servo 401. The mixers 409 and 445 then provide the mixed signals to the CW OPLL 411 and the CCW OPLL 447. As the CW resonance tracking servo 455 and the CCW resonance tracking servo 401 track the CW and CCW resonances of the resonator 423, the signals provided by the CW OPLL 411 and the CCW OPLL 447 drive the carrier frequencies of the light produced by the CW optical source 413 and the CCW optical source 449 to the resonances of the resonator 423. In particular, the signals provided by the CW OPLL 411 and CCW OPLL 447 drive the light produced by the CW optical source 413 and the CCW optical source 449 to be at the resonant frequencies of the resonator 423.

In certain embodiments, the CW optical signal, produced by the CW optical source 413, is coupled into a sideband heterodyne modulation phase modulator 415 that modulates the CW optical signal by a frequency that is substantially equal to a multiple of half of the free spectral range of the resonator 423. Similarly, the CCW optical signal, produced by the CCW optical source 449, is coupled into a sideband heterodyne modulation phase modulator 451 that also modulates the CCW optical signal by a frequency that is substantially equal to a multiple of half of the free spectral range of the resonator 423. Accordingly, the sideband heterodyne modulation phase modulator 415 provides CW optical signals at harmonic sidebands of the optical signal produced by the CW optical source 413, where the harmonic sidebands are at the modulation frequency applied by the sideband heterodyne modulation phase modulator 415. Similarly, the sideband heterodyne modulation phase modulator 451 provides CCW optical signals at harmonic sidebands of the optical signal produced by the CCW optical source 449, where the harmonic sidebands are at the modulation frequency applied by the phase modulator 451.

In some implementations, the CW optical signals provided by the sideband heterodyne modulation phase modulator 415 are provided to a coupler 417 that provides the CW optical signals to a circulator 419. Additionally, the master optical signal provided by the master optical source 435 may also be modulated by a phase modulator 437 that modulates the master optical signal at the same frequency called the PDH modulation frequency, which is used to determine the resonance frequency of the resonator for the PDH loop operation. The modulated master optical signal is also provided to the coupler 417. Thus, the coupler 417 couples the CW optical signals from the sideband heterodyne modulation phase modulator 415 and the modulated master optical signal from the phase modulator 437 onto the same optical path, referred to herein as the CW optical path. The CCW optical signals provided by the sideband heterodyne modulation phase modulator 451 are coupled off the integrated photonics circuitry 469 into a CCW optical path, which couples the CCW optical signals to a circulator 441.

In certain embodiments, the circulator 419 receives the CW optical signals and the master optical signal and couples the CW optical signals and the master optical signal into the lead line 406. The lead line 406 provides the CW optical signals and the master optical signal to an optical assembly 443. Similarly, the circulator 441 receives the CCW optical signals and couples the CCW optical signals into the lead line 408. The lead line 408 provides the CCW optical signals to the optical assembly 443.

In some embodiments, the structure of the optical assembly 443 may include any assembly or apparatus that supports the mounting and coupling of optical components. Further, the optical assembly 443 may include a substrate material that acts as a foundation onto which optical components can be placed, applied, or coupled. Such optical components may include lenses (e.g., ball lenses, concave lenses, convex lenses, compound lenses, gradient refractive index (GRIN) lenses, etc.), optical splitters, combiners, polarizers, optical circulators, or other optics. However, in other exemplary embodiments, the number of optical components should be reduced to prevent any unnecessary attenuation in power when extracting optical signals from the resonator 423 or in the resonator path itself. Moreover, the optical assembly 443 may optionally include an optical bench of suitable size for use within the RFOG 400. In some instances, the optical assembly 443 may be an optical bench constructed out of silicon or a glass substrate also referred to as a silicon optical bench.

In further embodiments, the optical assembly 443 is coupled to the lead line 406 and the lead line 408. The optical components of the optical assembly 443 receive the CW optical signals and master optical signal from the lead line 406 and couple the CW optical signals and master optical signal into the resonator 423 for propagation in the CW direction around the resonator 423. Similarly, the optical components of the optical assembly 443 receive the CCW optical signals from the lead line 408 and couple the CCW optical signals into the resonator 423 for propagation in the CCW direction around the resonator 423. Additionally, the optical assembly 443 may include optical components that couple the optical signals out of the resonator 423 for performing resonance tracking. For example, the optical assembly 443 may couple the light propagating in the CW direction out of the resonator 423 and into the lead line 408 towards the circulator 441. Also, the optical assembly 443 may couple the light propagating in the CCW direction out of the resonator 423 and into the lead line 406 towards the circulator 419. Additionally, the optical assembly 443 may couple the light propagating in the CW directions out of the resonator 423 for detection by a detector 421 at a reflection port if the resonator that is used for a Pound Drever Hall (PDH) feedback loop that is used for frequency-locking CW light to the resonator. Alternatively, although not shown in FIG. 4, the architectures may be constructed in which the optical assembly 443 couples light from the CCW direction via the CCW reflection port to form the basis for a PDH feedback loop. Optical assembly 443 also is constructed to provide maximum light coupling of optical power from one end of the fiber coil within resonator 423 to the other end of the coil within resonator 423. Thus, the optical assembly 443 couples light into and out of the resonator 423 while also completing the resonant loop of the resonator 423.

In certain embodiments, the circulator 419 couples the CCW optical signals into a CCW resonant tracking loop having the CCW resonance tracking servo 401. For example, the circulator 419 receives the CCW optical signals from the lead line 406 and provides the CCW optical signals to a CCW detector 407. The CCW detector 407 then converts the optical signal into an electrical signal for demodulation. Similarly, the circulator 441 couples the CW optical signals into a CW resonant tracking loop, having the CW resonance tracking servo 455. For example, the circulator 441 receives the CW optical signals from the lead line 408 and provides the CW optical signals to a CW detector 461.

In some embodiments, when the RFOG 400 implements sideband heterodyne detection, the CW resonance tracking loop and the CCW resonance tracking loop perform double demodulation. For example, within the CCW resonance tracking loop, the electrical signal produced by the CCW detector 407 is demodulated by the demodulator 405 by twice the sideband heterodyne frequency, which is equal to twice the modulation frequency applied to the CCW optical signals through the sideband heterodyne modulation phase modulator 451. After demodulation by the demodulator 405, the signal is further demodulated by the demodulator 403 at the common modulation frequency, which is associated with the frequency applied by the common phase modulator 439. The doubly demodulated signal is then used by the CCW resonance tracking servo 401 to identify adjustments to the frequency of the CCW optical signals to track the resonance of the resonator 423 in the CCW direction. Similarly, within the CW resonance tracking loop, the electrical signal produced by the CW detector 461 is demodulated by the demodulator 459 by twice the sideband heterodyne frequency, which is equal to twice the modulation frequency applied to the CW optical signals through the sideband heterodyne modulation phase modulator 415. After demodulation by the demodulator 459, the signal is further demodulated by the demodulator 457 at the common modulation frequency, which is associated with the frequency applied by the common phase modulator 439. The doubly-demodulated signal is then used by the CW resonance tracking servo 455 to identify adjustments to the frequency of the CW optical signals to track the resonance of the resonator 423 in the CW direction.

In additional embodiments, the electrical signal from the detector 421 is provided to the demodulator 467, which demodulates the electrical signal at a Pound-Drever-Hall (PDH) modulation frequency. The demodulated signal is then offset by a PDH loop offset by a summer 465. The signal is then provided to PDH loop circuitry 463. The PDH loop circuitry 463 is configured to lock the optical signal of the master optical source 435 to the same frequency as the resonance frequency of the resonator 423 or to a frequency located halfway between resonance peaks of the resonator 423.

In certain embodiments, the RFOG 400 includes a tapping optical coupler 427 placed within the resonator 423 to couple a portion of the light propagating within the resonator 423 out of the resonator 423. The tapping optical coupler 427 may function similarly to the tapping device 112 described above in relation to FIG. 3. In particular, the resonator 423 may circulate an optical signal propagating in the CW direction into the tapping optical coupler 427. The tapping optical coupler 427 may couple a small portion of the optical signal circulating in the CW direction into a CW tapping line 431. Also, the resonator 423 may circulate an optical signal propagating in the CCW direction into the tapping optical coupler 427. The tapping optical coupler 427 may couple a small portion of the optical signal circulating in the CCW direction into a CCW tapping line 425. The CW tapping line 431 and the CCW tapping line 425 may function similarly to the first output optical path 314 and the second output optical path 316 in FIG. 3.

In some embodiments, the RFOG 400 includes a combiner 429. The combiner 429 functions similarly to the combiner 318 described above in relation to FIG. 3. In particular, the combiner 429 is coupled to both the CCW tapping line 425 and the CW tapping line 431. The combiner 429 receives the optical signals from the CCW tapping line 425 and the CW tapping line 431, combines the optical signals, and outputs the combined optical signals through an output port for reception by a detector 433. The detector 433 may function similarly to the beat detector 322, as described in FIG. 3. In particular, the detector 433 detects the combined optical signal to form a beat note signal. The beat note signal is at a frequency representing a frequency separation between the CW optical signal and the CCW optical signal. The beat note signal can be processed to measure input lead fluctuations of the lead lines 406 and 408 and to compensate bias caused by the lead fluctuations in the output of an RFOG, or provide a signal free of lead fluctuation errors, to provide precise rotation rate information.

In some embodiments, the beat note signal may be provided to a processor that processes the beat note signal to correct for fluctuations in the lead lines 406 and 408 and the leads connecting integrated photonics circuitry 469 and circulators 419 and 441. The processor may be a computational device (such as a general-purpose processor, multi-core processor, multiple processors, dedicated circuitry, and the like). The functions performed by the processor may be implemented using software, firmware, hardware, or any appropriate combination thereof. The processor and other computational devices may be supplemented by, or incorporated in, specially designed application-specific integrated circuits (ASICs) or field programmable gate arrays (FPGAs). The processor and other computational devices can also include or function with software programs, firmware, or other computer-readable instructions for performing various process tasks, calculations, and control functions used in the present methods and systems.

The present methods may be implemented by computer-executable instructions, such as program modules or components executed by the processor or other computational devices. Generally, program modules include routines, programs, objects, data components, data structures, algorithms, and the like, which perform particular tasks or implement particular abstract data types.

The memory may be any suitable computer-readable storage media that includes, for example, non-volatile memory devices, including semiconductor memory devices such as random access memory (RAM), read-only memory (ROM), electrically erasable programmable ROM (EEPROM), or flash memory devices; magnetic disks such as internal hard disks or removable disks; optical storage devices such as compact discs (CDs), digital versatile discs (DVDs), Blu-ray discs, or other media that can carry or store desired program code as computer-executable instructions or data structures.

Figure 5:
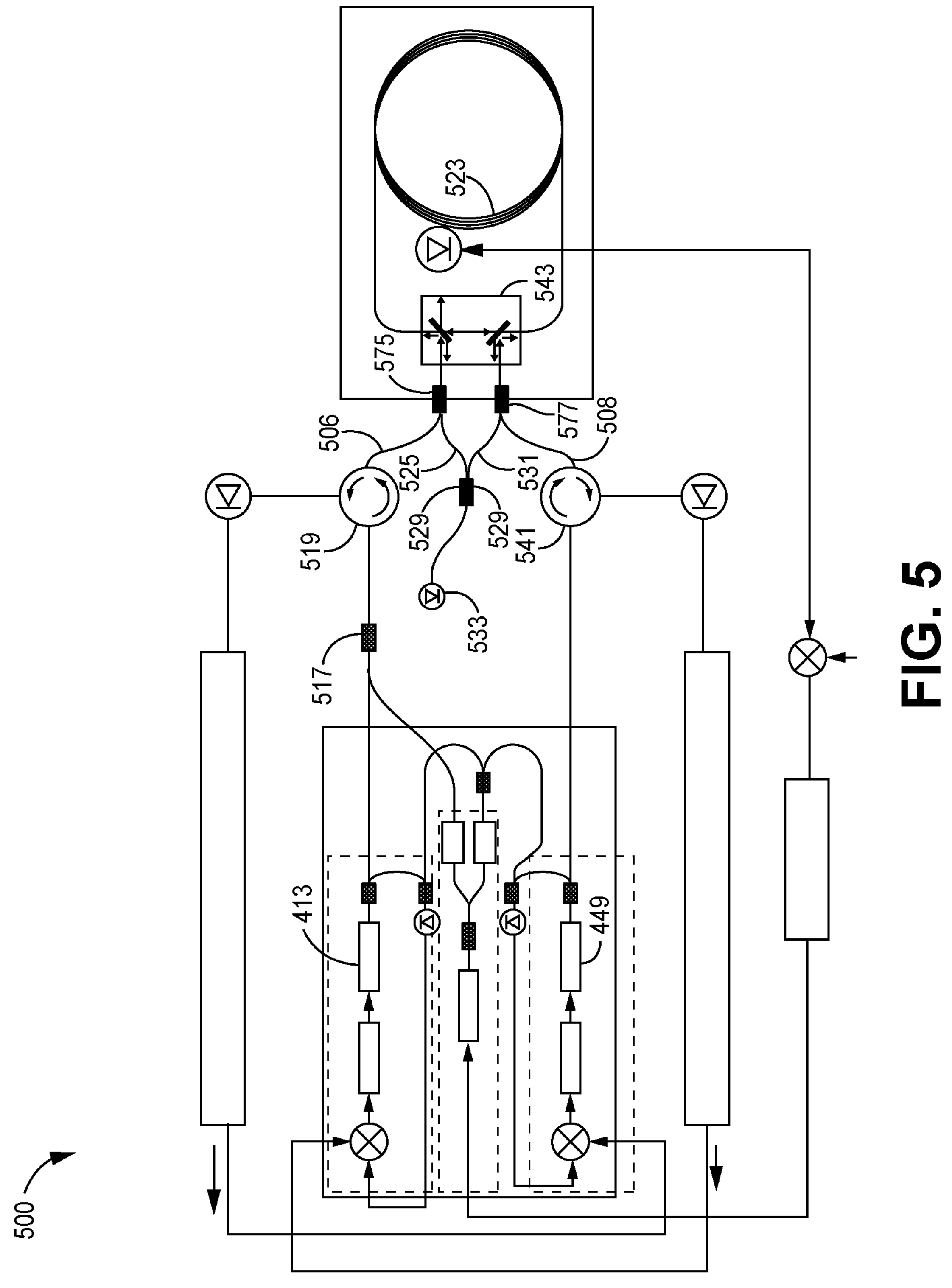
FIG. 5 is a schematic illustrating an RFOG that implements an optical circuit for compensating optical lead fluctuations according to an aspect of the present disclosure.

FIG. 5 is a block diagram of a system that incorporates an optical circuit for compensating optical lead fluctuations in an RFOG 500. In particular, the optical circuit in the RFOG 500 may use optical components on an optical assembly 543 to couple light out of the resonator for compensating fluctuations in the lead lines 506 and 508. The light coupled out of transmission ports of the resonator 523 by the optical assembly 543 can be used to detect and measure input lead fluctuations for compensating the gyro output based on the measured fluctuations in the lead lines. Also, components of the RFOGs 400 and 500 that have similar numbers perform similar functions. For example, a coupler 517 and the coupler 417 may perform similar functions.

In certain embodiments, the RFOG 500 may couple the CW optical signal into the circulator 519 for coupling into the lead line 506. Also, the RFOG 500 may couple the CCW optical signal into the circulator 519. The lead lines 506 and 508 couple the CW optical signal and the CCW optical signal onto the optical assembly 543 for coupling into the resonator 523. The CW optical signals and the CCW optical signals propagate around the resonator 523, and when the CW optical signals and the CCW optical signals pass through the optical assembly 543, transmission ports on the optical assembly 543 couple a portion of the CW optical signal and the CCW optical signal out of the resonant path of the resonator 523. For example, optical components on the optical assembly 543 may direct light out of the transmission ports of the resonator 523, functioning similarly to the tapping device 112 described above in FIG. 3. The optical components on the optical assembly 543 may couple the light back onto the lead lines 506 and 508.

In some embodiments, the RFOG 500 includes lead line couplers 575 and 577. The lead line couplers 575 and 577 are optical couplers, respectively, located on the lead lines 506 and 508. When the lead line couplers 575 and 577 receive optical signals from the circulators 519 and 541, the lead line couplers 575 and 577 couple the optical signals into the optical assembly 543. However, when the lead line couplers 575 and lead line couplers 577 receive optical signals from the transmission ports on the optical assembly 543, the lead line couplers 575 and 577 couple the optical signals onto tapping lines 525 and 531. For example, the CW optical signals may be coupled by the optical coupler 577 onto the CW tapping line 531. Additionally, the CCW optical signals may be coupled by the optical coupler 575 onto the CCW tapping line 525. Both the CW tapping line 531 and the CCW tapping line 525 couple the CW optical signals and the CCW optical signals into a combiner 529. The combiner 529 functions similarly to the combiner 318 described above in relation to FIG. 3 and the combiner 429 in FIG. 4. The combiner 529 receives the optical signals from the CCW tapping line 525 and the CW tapping line 531, combines the optical signals, and outputs the combined optical signals through an output port for reception by a detector 533. The combiner 5 function similarly to the beat detector 322 described in FIG. 3 and the detector 533 in FIG.

5. In particular, the detector 533 detects the combined optical signal to form a beat note signal containing a frequency at a frequency separation between the CW optical signal and the CCW optical signal.

Figure 6:
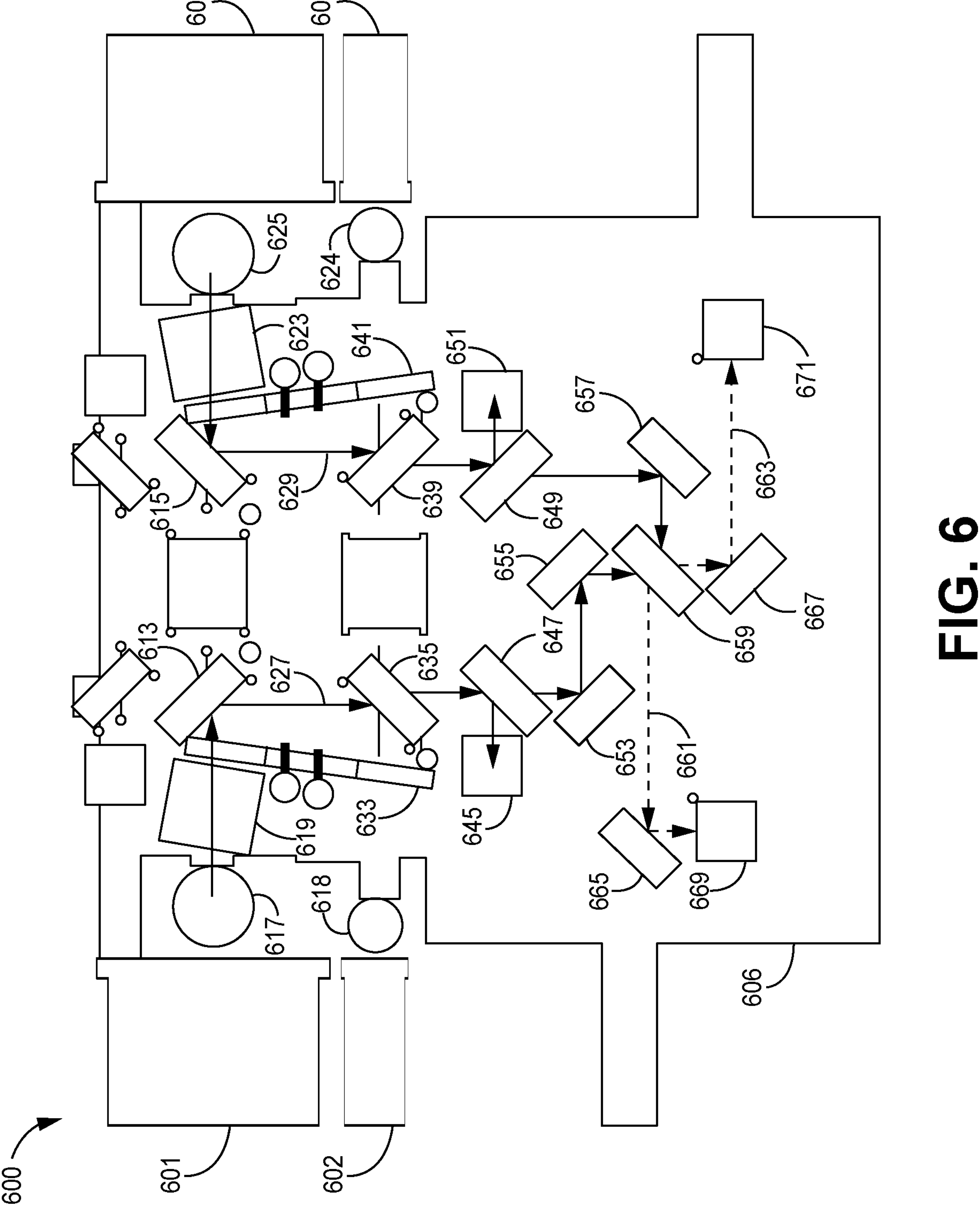
FIG. 6 is a diagram illustrating components of an optical assembly implementing an optical circuit for compensating optical lead fluctuations in an RFOG according to an aspect of the present disclosure.

FIG. 6 is a diagram illustrating optical components on an optical assembly 600, where the optical components can direct combined optical signals from the transmission ports to photodetectors. For example, the optical assembly 600 may be similar to the optical assembly 543 described above. As shown, the optical assembly 600 may be coupled to the ends of the resonator. For example, the optical assembly 600 may receive light propagating in the resonator from a first end 601 and a second end 603. The optical signal from the first end 601 may pass through a first lens 617, and the optical signal from the first end 603 may pass through a second lens 625. The first lens 617 and the second lens 625 may collimate the received light from the resonator coil onto optical components on the optical assembly 600.

In certain embodiments, the first lens 617 collimates the received optical signal for passage through a first rotating half-wave plate 619, and the second lens 625 collimates the received optical signal for passage through a second rotating half-wave plate 623. The first rotating half-wave plate 619 and the second rotating half-wave plate 623 are mounted on the optical assembly 600. The first rotating half-wave plate 619 may rotate the polarization orientation of the received optical signal for passage through a first polarizer 633, and the second rotating half-wave plate 623 may rotate the polarization orientation of the received optical signal for passage through a second polarizer 641. The first polarizer 633 and the second polarizer 641 may filter the received optical signal so that the optical signal passed through is in a particular polarization.

In some embodiments, an optical signal passes through the first polarizer 633 to be incident on a first beam splitter 613, and an optical signal passes through the second polarizer 641 to be incident on a second beam splitter 615. The first beam splitter 613 and the second beam splitter 615 may reflect a portion of the received optical signals and pass a portion of the received optical signals. In some implementations, each of the first beam splitter 613 and the second beam splitter 615 may reflect a small portion of the optical signals. For example, the first beam splitter 613 and the second beam splitter 615 may reflect 3.5 percent of the incident optical signals. When the first beam splitter 613 and the second beam splitter 615 reflect the incident optical signals, the first beam splitter 613 and the second beam splitter 615 direct the incident optical signals out of the resonant path of the resonator, respectively, as a first tapped optical signal 627 and a second tapped optical signal 629. The light that passes through the first beam splitter 613 and the second beam splitter 615 passes through for entrance into one of the first end 601 and the second end 603. For example, the optical signal incident on the second beam splitter 615 passes through the second beam splitter 615 and enters the first end 601. The transmitted portion of the optical signal incident on the first beam splitter 613 passes through the first beam splitter 613 and enters the second end 603.

In further embodiments, the first tapped optical signal 627 is passed through a first additional beam splitter 635, and the second tapped optical signal 629 is passed through a second additional beam splitter 639. Beamsplitters 635 and 639 are provided in order to bring optical signals from inputs 602 and 604 to the resonator. The optical signal from the CW input 602 travels through a ball lens 618 to the left of the polarizing element 633 to the beamsplitter 635 to the beamsplitter 613 and is reflected into the resonator coil end 601 for propagation in the CW direction. Similarly, optical signals from the CCW input 604 travels through a ball lens 624 to the right of the polarizing element 641 to the beamsplitter 639 then to the beamsplitter 615 and is reflected into the resonator coil end 603 to propagate in the resonator in the CCW direction. When the portion of the CW optical signal, propagating in the resonator, is tapped off by reflection from the beamsplitter 615, i.e., the beamsplitter 615 outputs an optical signal as a "transmission from the resonator." The tapped off optical signal is directed to the beamsplitter 639. The transmitted portion of power through the beamsplitter 639 is then directed to a reflector 657 (via transmission through the beamsplitter 649), and to the beamsplitter 659 to form optical signal paths 661 and 663 that are used for beat note detections. Likewise, when the portion of the CCW optical signal, propagating in the resonator, is tapped off by reflection from the beamsplitter 613, i.e., the beamsplitter 613 outputs an optical signal as a "transmission from the resonator." The tapped off optical signal is directed to beamsplitter 635. The transmitted portion of power through the beamsplitter 635 is then directed to a reflector 653 (via transmission through the beamsplitter 647), and then to the reflector 655 and then to a beamsplitter 659 to form optical signal paths 661 and 663 that are used for beat note detection. The optical signal paths 661 and 663 each have collinear outputs that have been derived from portions of optical signals traveling in the CW and CCW directions. Additionally, it should be noted that the first additional beam splitter 635 and the second additional beam splitter 639 may respectively split the first tapped optical signal 627 and the second tapped optical signal 629, and direct a portion of the first tapped optical signal 627 and the second tapped optical signal 629 back into where optical signal inputs enter assembly 606, namely into the ports to the left of the polarizer 633, and to the right of the polarizer 641. Each of those portions of output light 627 and 629 that are reflected by beamsplitters 635 and 639 respectively, are not used for the beat note signal as they are directed back toward the circulators 519 and 541 of FIG. 5, respectively where they are used on the CCW and CW output signals, as previously discussed. In some implementations, the first additional beam splitter 635 and the second additional beam splitter 639 may reflect a large proportion of the first-tapped optical signal 627 and the second-tapped optical signal 629 back to the circulators as CCW and CW resonance tracking signals.

In additional embodiments, the portion of the first-tapped optical signal 627 and the second-tapped optical signal 629 that pass through the first additional beam splitter 635 and the second additional beam splitter 639 are then incident on transmission port splitters 647 and 649. The transmission port splitters 647 and 649 direct half (or some other portion) of the first tapped optical signal 627 and the second tapped optical signal 629 to transmission port outputs 645 and 651. The transmission port outputs 645 and 651 may direct optical signals out of the optical assembly 600 to components above the optical assembly 600 (like a photodetector, such as the detector 421 in FIG. 4). For example, the transmission port outputs 645 and 651 may be diffraction gratings or micro-mirrors that receive optical signals and direct the optical signals out of the optical assembly 600. Transmission outputs 645 and 651 are indicative of the power circulating in the resonator in the CCW and the CW directions, respectively, and may be used for input power stabilization or other purposes, but not beat note detection.

In certain embodiments, the portion of the first tapped optical signal 627 and the second tapped optical signal 629 that passes through the transmission port splitters 647 and 649 are directed through a series of mirrors 653, 655, and 657 to a combining beam splitter 659. For example, the portion of the first tapped optical signal 627 that passes through the transmission port splitters 647 is directed by mirrors 653 and 655 to one side of the combining beam splitter 659. Also, the portion of the second tapped optical signal 629 that passes through the transmission port splitter 649 is directed by mirror 657 to the other side of the combining beam splitter 659. The combining beam splitter 659 may be a 50 percent beam splitter that passes half of the incident light through the combining beam splitter 659 and reflects the other half of the incident light. As the first-tapped optical signal 627 and the second-tapped optical signal 629 are incident on opposite sides of the combining beam splitter 659, combined portions of the first-tapped optical signal 627 and the second-tapped optical signal 629 are directed from each surface of the combining beam splitter 659. For example, a first combined signal 661, comprising nominally half of the first tapped optical signal 627 and the second tapped optical signal 629 incident on the combining beam splitter 659, is directed towards a mirror 665. A second combined signal 663, comprising other nominal halves of the first tapped optical signal 627 and the second tapped optical signal 629 incident on the combining beam splitter 659, is directed towards a mirror 667.

In further embodiments, the mirrors 665 and 667 direct the combined optical signals towards beat note outputs 669 and 671. For example, the mirror 665 reflects the first combined signal 661 towards the first beat note output 669. Also, the mirror 667 reflects the second combined signal 663 towards the second beat note output 671. The first beat note optical components 669 and 671 may be similar components to the transmission port outputs 645 and 651. Thus, the first beat note output 669 may direct the first combined signal 661 to a beat note detector near the optical assembly 600. The second beat note output 671 may also direct the second combined signal 663 to a beat note detector near the optical assembly 600. As described above, the optical assembly 600 can extract portions of the propagating light within the resonator for combining and detection.

Figure 7:
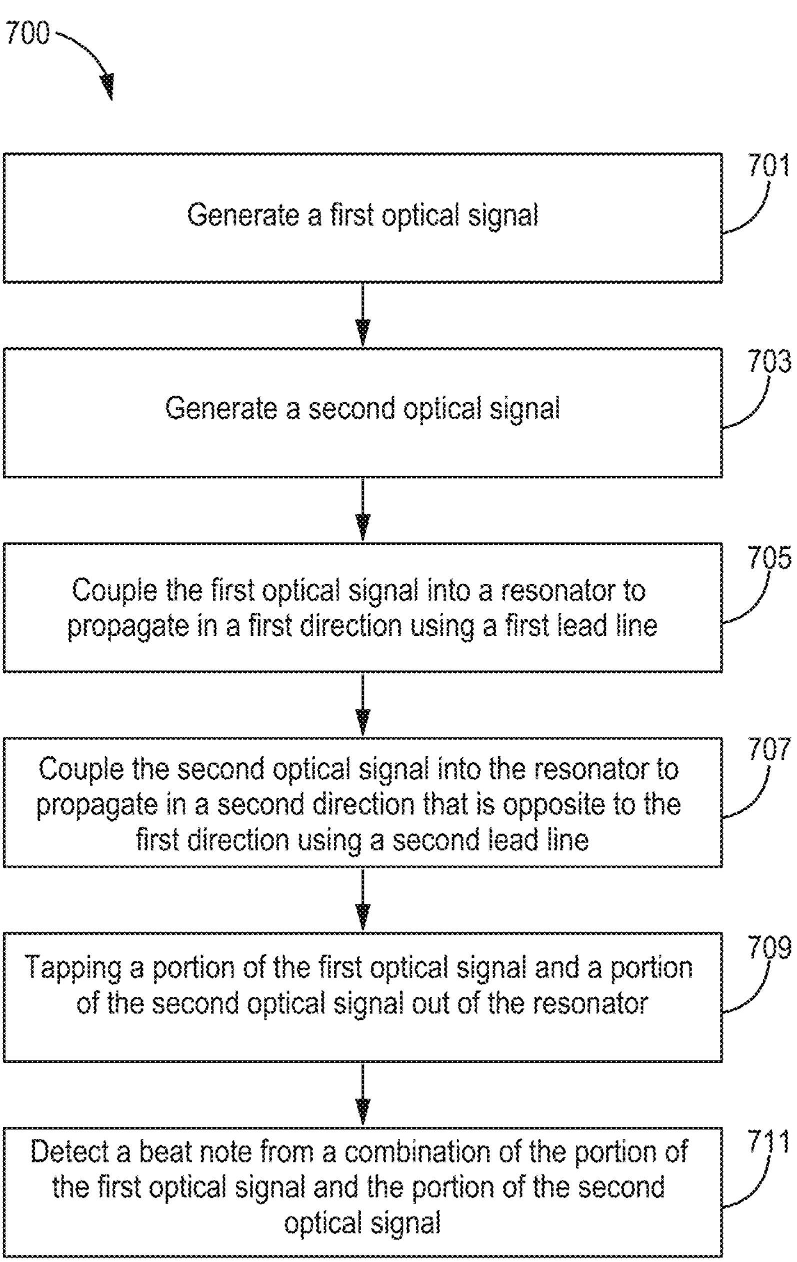
FIG. 7 is a flowchart diagram illustrating a method for compensating lead fluctuations according to an aspect of the present disclosure.

FIG. 7 is a flow diagram of a method 700 for compensating optical lead fluctuations in an RFOG. As shown, the method 700 proceeds at 701, where a first optical signal is generated. Further, the method 700 proceeds at 703, where a second optical signal is generated. Also, the method 700 proceeds at 705, where the first optical signal is coupled into a resonator to propagate in a first direction using a first lead line. Additionally, the method 700 proceeds at 707, where the second optical signal is coupled into the resonator to propagate in a second direction that is opposite to the first direction using a second lead line. Moreover, the method 700 proceeds at 709, where a portion of the first optical signal and a portion of the second optical signal is tapped out of the resonator. The method 700 also proceeds at 711, where a beat note is detected from a combination of the portion of the first optical signal and the portion of the second optical signal.

Example Embodiments

Example 1 includes a resonant fiber optic gyroscope (RFOG), comprising: at least two optical signal sources configured to generate a first optical signal and a second optical signal; an optical resonator; a first lead line connected to the optical source and the optical resonator, wherein the optical source couples the first optical signal into the first lead line, and the first lead line couples the first optical signal into the optical resonator for propagation in a first direction within the optical resonator; a second lead line connected to the optical source and the optical resonator, wherein the optical source couples the second optical signal into the second lead line, and the second lead line couples the second optical signal into the optical resonator for propagation in a second direction within the optical resonator, wherein the second direction is opposite the first direction; a tapping device coupled to the optical resonator, wherein the tapping device couples a portion of the first optical signal propagating in the optical resonator and a portion of the second optical signal propagating in the optical resonator out of the optical resonator; a combiner coupled to the tapping device, wherein the combiner combines the portion of the first optical signal and the portion of the second optical signal to produce a combined output; and one or more photodetectors coupled to receive the combined output from the combiner, wherein the one or more photodetectors generate a beat note signal from the combined output.

Example 2 includes the RFOG of Example 1, wherein the tapping device comprises an optical coupler placed in a resonant path of the optical resonator, wherein the optical coupler couples the portion of the first optical signal into a first tapping line and the portion of the second optical signal into a second tapping line, wherein the first tapping line and the second tapping line are coupled to the combiner.

Example 3 includes the RFOG of any of Examples 1-2, wherein the first lead line and the second lead line are coupled to an optical assembly that directs the first optical signal and the second optical signal into and out of the optical resonator.

Example 4 includes the RFOG of Example 3, wherein the optical assembly comprises optical components that direct the portion of the first optical signal into a first tapping line and the portion of the second optical signal into a second tapping line, wherein the first tapping line and the second tapping line are coupled to the combiner.

Example 5 includes the RFOG of any of Examples 3-4, wherein the optical assembly comprises optical components that comprise the tapping device and the combiner, wherein the optical assembly provides the combined output to the one or more photodetectors.

Example 6 includes the RFOG of any of Examples 1-5, further comprising a beat note processor configured to receive the beat note signal from the one or more photodetectors and compensate measurements for fluctuations in the first lead line and the second lead line.

Example 7 includes the RFOG of any of Examples 1-6, wherein the first optical signal and the second optical signal are each modulated with common modulation and sideband heterodyne modulation.

Example 8 includes the RFOG of Example 7, wherein the common modulation modulates the first optical signal and the second optical signal to be at a free spectral range of the optical resonator.

Example 9 includes a method comprising: generating a first optical signal; generating a second optical signal; coupling the first optical signal into a resonator to propagate in a first direction using a first lead line; coupling the second optical signal into the resonator to propagate in a second direction that is opposite to the first direction using a second lead line; tapping a portion of the first optical signal and a portion of the second optical signal out of the resonator; and detecting a beat note from a combination of the portion of the first optical signal and the portion of the second optical signal.

Example 10 includes the method of Example 9, wherein coupling the first optical signal into the resonator and coupling the second optical signal into the resonator comprises: coupling the first optical signal into an optical assembly through the first lead line; coupling the second optical signal into the optical assembly through the second lead line; and introducing the first optical signal and the second optical signal into the resonator from the optical assembly.

Example 11 includes the method of Example 10, wherein optical components on the optical assembly direct the portion of the first optical signal and the portion of the second optical signal to a combiner through a first tapping line and a second tapping line.

Example 12 includes the method of any of Examples 10-11, wherein the tapping is performed by optical components on the optical assembly and the optical components combine the portion of the first optical signal and the portion of the second optical signal to output the combination of the portion of the first optical signal and the portion of the second optical signal.

Example 13 includes the method of any of Examples 9-12, wherein the tapping is performed by an optical coupler located in a resonant path of the resonator, wherein the optical coupler couples the portion of the first optical signal into a first tapping line and the portion of the second optical signal into a second tapping line.

Example 14 includes the method of any of Examples 9-13, further comprising at least one of compensating measurements for fluctuations in the first lead line and the second lead line based on the detected beat note; and providing a measurement of rotation rate that is free of errors due to fluctuations in the first lead line and the second lead line based on the detected beat note.

Example 15 includes the method of any of Examples 9-14, further comprising modulating the first optical signal and the second optical signal with common modulation and sideband heterodyne modulation.

Example 16 includes the method of Example 15, wherein the sideband heterodyne modulation is performed at a frequency associated with a free spectral range of the resonator.

Example 17 includes a system comprising: at least two optical signal sources configured to generate a CW optical signal and a CCW optical signal; an optical resonator coil; a first lead line connected to the optical source and the optical resonator coil, wherein the optical source couples the CW optical signal into the first lead line, and the first lead line couples the CW optical signal into the optical resonator coil to propagate in a CW direction within the optical resonator coil; a second lead line connected to the optical source and the optical resonator coil, wherein the optical source couples the CCW optical signal into the second lead line, and the second lead line couples the CCW optical signal into the optical resonator coil to propagate in a CCW direction within the optical resonator coil; a tapping device coupled to the optical resonator coil, wherein the tapping device couples a portion of the CW optical signal propagating in the optical resonator coil and a portion of the CCW optical signal propagating in the optical resonator coil out of the optical resonator coil; a combiner coupled to the tapping device, wherein the combiner combines the portion of the CW optical signal and the portion of the CCW optical signal to produce a combined output; one or more photodetectors coupled to receive the combined output from the combiner, wherein the one or more photodetectors generate a beat note signal from the combined output; and a beat note processor configured to receive the beat note signal from the one or more photodetectors and compensate measurements for fluctuations in the first lead line and the second lead line.

Example 18 includes the system of Example 17, wherein the tapping device comprises an optical coupler placed in a resonant path of the optical resonator coil, wherein the optical coupler couples the portion of the CW optical signal into a first tapping line and the portion of the CCW optical signal into a second tapping line, wherein the first tapping line and the second tapping line are coupled to the combiner.

Example 19 includes the system of any of Examples 17-18, wherein the first lead line and the second lead line are coupled to an optical assembly that directs the first optical signal and the second optical signal into and out of the optical resonator coil, wherein the optical assembly comprises optical components that direct the portion of the CW optical signal into a first tapping line and the portion of the CCW optical signal into a second tapping line, wherein the first tapping line and the second tapping line are coupled to the combiner.

Example 20 includes the system of any of Examples 17-19, wherein the first lead line and the second lead line are coupled to an optical assembly that directs the CW optical signal and the CCW optical signal into and out of the resonator, wherein the optical assembly comprises optical components that comprise the tapping device and the combiner, wherein the optical assembly provides the combined output to the one or more photodetectors.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A resonant fiber optic gyroscope (RFOG), comprising:

at least two optical signal sources configured to generate a first optical signal and a second optical signal;

an optical resonator;

a first lead line connected to a first subset of optical signal sources of the at least two optical signal sources and the optical resonator, wherein the first subset of optical signal sources couples the first optical signal into the first lead line, and the first lead line couples the first optical signal into the optical resonator for propagation in a first direction within the optical resonator;

a second lead line connected to a second subset of optical signal sources of the at least two optical signal sources and the optical resonator, wherein the second subset of optical signal sources couples the second optical signal into the second lead line, and the second lead line couples the second optical signal into the optical resonator for propagation in a second direction within the optical resonator, wherein the second direction is opposite the first direction;

a tapping device coupled to the optical resonator, wherein the tapping device couples a portion of the first optical signal propagating in the optical resonator and a portion of the second optical signal propagating in the optical resonator out of the optical resonator;

a combiner coupled to the tapping device, wherein the combiner combines the portion of the first optical signal and the portion of the second optical signal to produce a combined output; and one or more photodetectors coupled to receive the combined output from the combiner, wherein the one or more photodetectors generate a beat note signal from the combined output.

2. The RFOG of claim 1, wherein the tapping device comprises an optical coupler placed in a resonant path of the optical resonator, wherein the optical coupler couples the portion of the first optical signal into a first tapping line and the portion of the second optical signal into a second tapping line, wherein the first tapping line and the second tapping line are coupled to the combiner.

3. The RFOG of claim 1, wherein the first lead line and the second lead line are coupled to an optical assembly that directs the first optical signal and the second optical signal into and out of the optical resonator.

4. The RFOG of claim 3, wherein the optical assembly comprises optical components that direct the portion of the first optical signal into a first tapping line and the portion of the second optical signal into a second tapping line, wherein the first tapping line and the second tapping line are coupled to the combiner.

5. The RFOG of claim 3, wherein the optical assembly comprises optical components that comprise the tapping device and the combiner, wherein the optical assembly provides the combined output to the one or more photodetectors.

6. The RFOG of claim 1, further comprising a beat note processor configured to receive the beat note signal from the one or more photodetectors, wherein the beat note processor is configured to at least one of:

compensate measurements for fluctuations in the first lead line and the second lead line; and provide a measurement of rotation rate that is free of errors due to fluctuations in the first lead line and the second lead line based on the detected beat note.

7. The RFOG of claim 1, wherein the first optical signal and the second optical signal are each modulated with common modulation and sideband heterodyne modulation.

8. The RFOG of claim 7, wherein the common modulation modulates the first optical signal and the second optical signal to locate the resonances of the optical resonator.

9. A method comprising:

generating a first optical signal;

generating a second optical signal;

coupling the first optical signal into a resonator to propagate in a first direction using a first lead line;

coupling the second optical signal into the resonator to propagate in a second direction that is opposite to the first direction using a second lead line;

tapping a portion of the first optical signal and a portion of the second optical signal out of the resonator; and detecting a beat note from a combination of the portion of the first optical signal and the portion of the second optical signal.

10. The method of claim 9, wherein coupling the first optical signal into the resonator and coupling the second optical signal into the resonator comprises:

coupling the first optical signal into an optical assembly through the first lead line;

coupling the second optical signal into the optical assembly through the second lead line; and introducing the first optical signal and the second optical signal into the resonator from the optical assembly.

11. The method of claim 10, wherein optical components on the optical assembly direct the portion of the first optical signal and the portion of the second optical signal to a combiner through a first tapping line and a second tapping line.

12. The method of claim 10, wherein the tapping is performed by optical components on the optical assembly and the optical components combine the portion of the first optical signal and the portion of the second optical signal to output the combination of the portion of the first optical signal and the portion of the second optical signal.

13. The method of claim 9, wherein the tapping is performed by an optical coupler located in a resonant path of the resonator, wherein the optical coupler couples the portion of the first optical signal into a first tapping line and the portion of the second optical signal into a second tapping line.

14. The method of claim 9, further comprising at least one of:

compensating measurements for fluctuations in the first lead line and the second lead line based on the detected beat note; and providing a measurement of rotation rate that is free of errors due to fluctuations in the first lead line and the second lead line based on the detected beat note.

15. The method of claim 9, further comprising modulating the first optical signal and the second optical signal with common modulation and sideband heterodyne modulation.

16. The method of claim 15, wherein the sideband heterodyne modulation is performed at a frequency associated with a free spectral range of the resonator.

17. A system comprising:

at least two optical signal sources configured to generate a CW optical signal and a CCW optical signal;

an optical resonator coil;

a first lead line connected to a first subset of optical signal sources of the at least two optical signal sources and the optical resonator coil, wherein the first subset of optical signal sources couples the CW optical signal into the first lead line, and the first lead line couples the CW optical signal into the optical resonator coil to propagate in a CW direction within the optical resonator coil;

a second lead line connected to a second subset of optical signal sources the at least two optical signal sources and the optical resonator coil, wherein the second subset of two optical signal sources couples the CCW optical signal into the second lead line, and the second lead line couples the CCW optical signal into the optical resonator coil to propagate in a CCW direction within the optical resonator coil;

a tapping device coupled to the optical resonator coil, wherein the tapping device couples a portion of the CW optical signal propagating in the optical resonator coil and a portion of the CCW optical signal propagating in the optical resonator coil out of the optical resonator coil;

a combiner coupled to the tapping device, wherein the combiner combines the portion of the CW optical signal and the portion of the CCW optical signal to produce a combined output;

one or more photodetectors coupled to receive the combined output from the combiner, wherein the one or more photodetectors generate a beat note signal from the combined output; and a beat note processor configured to receive the beat note signal from the one or more photodetectors.

18. The system of claim 17, wherein the tapping device comprises an optical coupler placed in a resonant path of the optical resonator coil, wherein the optical coupler couples the portion of the CW optical signal into a first tapping line and the portion of the CCW optical signal into a second tapping line, wherein the first tapping line and the second tapping line are coupled to the combiner.

19. The system of claim 17, wherein the first lead line and the second lead line are coupled to an optical assembly that directs the first optical signal and the second optical signal into and out of the optical resonator coil, wherein the optical assembly comprises optical components that direct the portion of the CW optical signal into a first tapping line and the portion of the CCW optical signal into a second tapping line, wherein the first tapping line and the second tapping line are coupled to the combiner.

20. The system of claim 17, wherein the first lead line and the second lead line are coupled to an optical assembly that directs the CW optical signal and the CCW optical signal into and out of the resonator, wherein the optical assembly comprises optical components that comprise the tapping device and the combiner, wherein the optical assembly provides the combined output to the one or more photodetectors.

* * * * *